United States Patent [19]

Iwanami

[11] 4,284,999
[45] Aug. 18, 1981

[54] SEMICONDUCTOR DEVICE

[75] Inventor: Eiichi Iwanami, Tokyo, Japan

[73] Assignee: Kabushiki Kaisha Daini Seikosha, Tokyo, Japan

[21] Appl. No.: 973,589

[22] Filed: Dec. 27, 1978

[30] Foreign Application Priority Data

Dec. 28, 1977 [JP] Japan .................. 52/158389

[51] Int. Cl.³ .......................................... H01L 29/80
[52] U.S. Cl. ..................................... 357/22; 357/41; 357/55
[58] Field of Search ............................ 351/22, 55, 41

[56] References Cited

U.S. PATENT DOCUMENTS

| | | | |
|---|---|---|---|
| 4,156,879 | 5/1979 | Lee | 357/55 |
| 4,167,745 | 9/1979 | Ishibashi | 357/55 |
| 4,198,648 | 4/1980 | Nishizawa | 357/55 |

*Primary Examiner*—Edward J. Wojciechowicz

*Attorney, Agent, or Firm*—Robert E. Burns; Emmanuel J. Lobato; Bruce L. Adams

[57] ABSTRACT

An integrated semiconductor junction field effect transistor logic device has a semiconductor substrate of one conductivity type having a high impurity concentration and a relatively low impurity concentration epitaxial semiconductor layer of the same conductivity type formed on the substrate and constituting a channel region. Two parallel grooves are formed in a surface portion of the epitaxial layer with a ridge between them. A drain region of the same conductivity type as the substrate is formed the ridge between the two grooves while a gate region of opposite conductivity type has a portion under one groove and a portion under and along the outer side of the other groove. A drain electrode is provided on the ridge between the two grooves and a gate electrode is provided on the gate region along the outer side of one groove. Since the gate-drain capacity is reduced, the semiconductor device can operate at high speed.

6 Claims, 6 Drawing Figures

SEMICONDUCTOR DEVICE

BACKGROUND OF THE INVENTION

This invention relates to the novel structure of a static induction transistor which has an advantage of high packing density, and it is an object of this invention to improve a delay-power product. The static induction transistor is an element which operates with high speed and low power consumption.

In a static induction transistor, drain current is controlled by changing a potential barrier which controls a carrier flowing from the source to the drain.

SUMMARY OF THE INVENTION

It is an object of the present invention to provide an integrated semiconductor junction field effect transistor logic device in which a surface of an epitaxial semiconductor layer on a substrate of the same conductivity type is grooved so as to increase the distance from a drain region to a gate region. Since the gate-drain capacity is thereby reduced, the simi-conductor device can operate at high speed.

DESCRIPTION OF PRIOR ART

Figure 1:
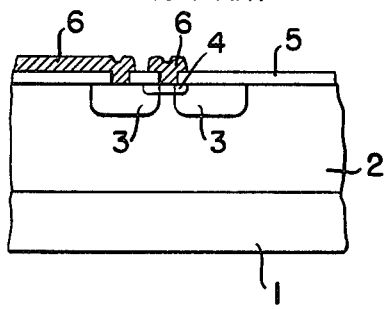
FIG. 1 is a sectional view of a conventional static induction transistor.

FIG. 1 is a sectional view showing the conventional structure of a static induction transistor.

In FIG. 1, numeral 1 represents an N conductivity type-substrate serving as a source region, numeral 2 represents an N conductivity type-channel region having an impurity concentration of the order of about $10^{13}$–$10^{14}$ per $cm^3$, wherein the N conductivity type-channel 2 is grown on the source region 1 by the method of epitaxial growth or the like. Numeral 3 is a P conductivity type-gate region having an impurity concentration not less than $10^{18}$, wherein the gate region is formed by thermal diffusion or ion implantation. Numeral 4 is an N conductivity type-drain region which has higher impurity concentration than that of the gate region 3 and is formed by thermal diffusion, ion implantation or the like. Numeral 5 is an insulating film, and numerals 6 and 6' are metal electrodes made of aluminum or the like. The operation of the static induction transistor shown in FIG. 1 is described as follows:

When a carrier is not injected from the transistor serving for an injector, the voltage between the gate and the source drops.

Accordingly the depletion layer formed between the gate region 3 and channel region 2 spreads widely into the channel region 2, and the channel region 2 becomes completely a depletion layer which acts as a potential barrier to the carrier flowing from the source region 1 to the drain region 4, since the channel region 2 is under the drain region 4 and is surrounded by the gate region 3. Therefore current does not flow from the drain to the source.

When the carrier is injected from the transistor serving for an injector and the PN junction between the gate and the source is biased in the forward direction, the potential barrier is decreased and current begins to flow from the drain to the source. In the delay power product a logic element having a PNP bipolar transistor for the injector and the static induction transistor is superior to the $I^2L$ (Intergrated Injection Logic) realized recently as an element operating with lower power consumption.

However, the disadvantages of the conventional structure shown in FIG. 1 are as follows:

(1) The frequency characteristic becomes bad because of the capacity between the gate and the drain, wherein the capacity is increased by the enlargement of the adjacent area between the gate region and the drain region having a high impurity concentration.

(2) As the potential barrier is adjacent to the drain region 4, the potential barrier is decreased by the drain potential and a large current flows between the drain and the source.

(3) As the potential barrier is decreased by the drain potential, the interval of the gate region 3 must not be greater than several microns in order to make a high potential barrier. Therefore, the dispersion of masking accuracy and the characteristics produced by processes of manufacture come to be increased. It is an object of this invention to improve the defect mentioned above, that is, it is an object of this invention to provide a novel structure of a static induction transistor of which the gate is not adjacent to the drain. This invention is described in conjunction with FIGS. 2 (a) to 4 of the drawings.

DESCRIPTION OF PREFERRED EMBODIMENTS

Figure 2A:
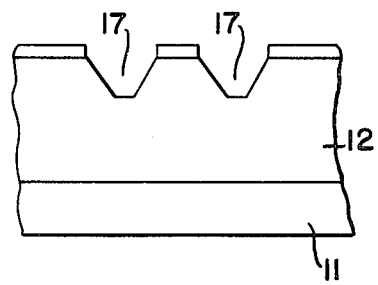
FIG. 2 (a) 2 (b) and 2 (c) are sectional views which show successive steps in the process of making the static induction transistor of this invention.
Figure 2B:
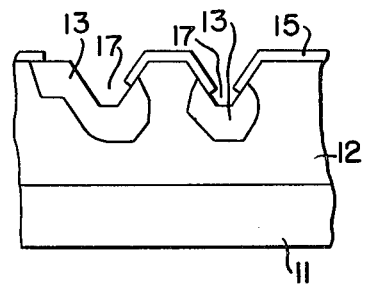
Figure 2C:
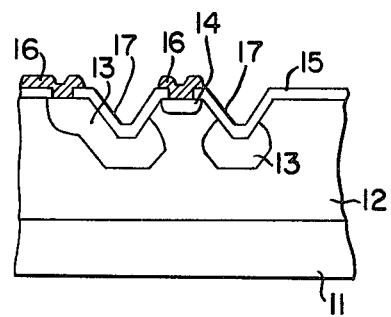

FIGS. 2 (a)–(c) show the process of making the semiconductor device of this invention.

The channel region 12 having an impurity concentration of the order of $10^{13}$–$10^{14}$ per $cm^3$ is formed on the N type-conductivity substrate 11 having a high impurity concentration by the epitaxial growth method wherein the N type-conductivity substrate 11 of orientation <100> serves as the source region. After that, when the substrate is a crystal of orientation 100, a selective mesa etching is done in the channel region 12 in order to form a grooves 17 shown in FIG. 2 (a). Then, as shown in FIG. 2 (b) the gate region 13 of P conductivity type is formed by thermal diffusion or the like so that a part of the gate under the grooves 17 gets to the main surface of the channel region 12, wherein the gate region has an impurity concentration which is not less than $10^{18}$ per $cm^3$. After that, the drain region 14 of N conductivity type is formed along the surface of the channel region 12 by thermal diffision an ion implantation or the like, wherein the drain region 14 has an impurity concentration not less that $10^{18}$ per $cm^3$. Then as shown in FIG. 2 (c) after contact holes for metal electrodes are formed in an insulating layer 15 on the respective main surface of the gate region and the drain region, metal electrodes 16 of aluminium or the like are formed by evaporation deposit or the like. Particularly, forming these grooves in an integrated circuit makes a metal thin film lead exist naturally thereon.

Accordingly, it often occurs that this metal thin film lead is cut, so that the yield of the integrated circuit is greatly increased.

Figure 3:
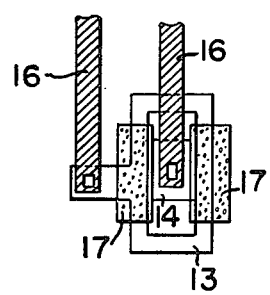
FIG. 3 is a plan view of the static induction transistor of this invention.

FIG. 3 shows a plan view of a first embodiment of this invention, wherein the embodiment represents the transistor having grooves 17 as described above. Generally the height of the gate potential barrier is determined by the inside interval of the gate 13 shown in FIG. 2 (c). However as a part of the channel region 12 is formed between the drain region 14 and the gate region 13 as shown in FIG. 2 (c) by making the grooves 17, and also this part is formed in the longitudinal direction of the drain region 14 shown in FIG. 3 at the same time, it is understood that the capacity between the gate and the drain of this part becomes smaller in the longitudinal direction of the drain region 14. Here it is not necessary to make the grooves in the lateral direction of the drain region 14 as shown in FIG. 3 in order to get the object of this invention since the interval between the gate and the drain is greater in this direction, that is, the capacity between the gate and the drain is small in this direction.

The grooves 17 are only formed in the longitudinal direction of the drain region 14 shown in FIG. 3. As the metal electrode 6 for the drain is formed on a ridge between the two grooves 17, it is never formed in the two gooves 17. In order to decrease the yield of the integrated circuit it is not necessary to make the grooves in the direction of the drain.

Figure 4:
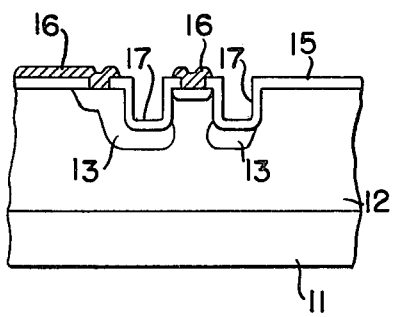
FIG. 4 is a sectional view of another embodiment of this invention.

FIG. 4 shows second embodiment of this invention. If crystal of orientation 111 or 110 is used as the substrate of N conductivity type, and etching of the channel layer 2 is done, rectangular grooves 17 are formed as shown in FIG. 4. In this case, it is also possible to obtain a semiconductor having a low impurity concentration between the gate region and the drain region by the same fabricating method illustrated in FIGS. 2 (a) to 2 (c).

The embodiment of this invention is not only fabricated by using a channel of the N conductivity type but also by using a channel of the P conductivity type.

As seen from the description mentioned above, it is possible by this invention to separate the gate region from the drain region, so that the capacity between the gate and the drain can be decreased. Accordingly, the frequency characteristic becomes better and the integrate circuit can be operated with less power consumption.

I claim:

1. An integrated semiconductor junction field effect transistor logic device, comprising: a semiconductor substrate of one conductivity type having a high impurity concentration; a relatively low impurity concentration epitaxial semiconductor layer of the same conductivity type as said substrate formed on said substrate; a first region of the same conductivity type as the substrate formed in a surface portion of said epitaxial layer; at least one groove formed in a surface portion of said epitaxial layer along a length direction of said first region; a second region of opposite conductivity type formed by said groove and in a surface portion of said epitaxial layer around said first region, and having a high impurity concentration; said substrate, said first region, the portion of said epitaxial layer under said first region, and said second region forming respectively the source, drain, channel and gate regions of a vertical junction field effect transistor, whereby gate-drain capacity is reduced.

2. An integrated semiconductor junction field effect transistor logic device according to claim 1, in which two said grooves are formed in said surface portion of said epitaxial layer, said grooves being equidistantly spaced apart with a ridge between them, said drain region being in said ridge.

3. An integral semiconductor junction field effect transistor logic device according to claim 2, in which said gate region is in the form of a hollow rectangle with one portion disposed under one of said grooves and another portion disposed under and along an outer side of the other of said grooves.

4. An integrated semiconductor junction field effect transistor logic device according to claim 3, in which one electrode is provided on said ridge in contact with said drain region and a second electrode is provided in contact with said portion of said gate region along an outer side of the other of said grooves.

5. An integrated semiconductor junction field effect transistor logic device according to claim 1, in which the impurity concentrations of the channel, gate and drain regions are as follows:

| Channel region | | $10^{13-14}$ per cm$^3$ |
| Gate region | $\geq$ | $10^{18}$ per cm$^3$ |
| Drain region | $\geq$ | $10^{18}$ per cm$^3$ |

6. An integrated semiconductor junction field effect transistor logic device according to claim 1, in which said gate region is formed in the bottom of said groove and has a portion extending up along a side of said groove, an electrode being provided in contact with said portion of said gate region extending up along side said groove.

* * * * *